(12) United States Patent
Diels et al.

(10) Patent No.: US 6,279,648 B1
(45) Date of Patent: Aug. 28, 2001

(54) METHOD OF MANUFACTURING COOLING DEVICES MADE UP OF SEVERAL METAL SHAPED-SECTION ELEMENTS FOR MOUNTING ON SEMICONDUCTOR COMPONENTS, SHAPED-SECTION ELEMENTS FOR USE IN THE MANUFACTURE OF SUCH COOLING DEVICES, AND COOLING DEVICES MANUFACTURED BY THE METHOD

(75) Inventors: Manfred Diels, Hohbueschener Weg 1, D-58540 Meinerzhagen; Joachim Bayer, deceased, late of Overrath, both of (DE), by Martina Bockholt-Bayer, heir (73) Assignee: Manfred Diels, Meinerzhagen (DE)

( * ) Notice: Subject to any disclaimer, the term of this patent is extended or adjusted under 35 U.S.C. 154(b) by 0 days.

(21) Appl. No.: 09/584,803

(22) Filed: May 31, 2000

Related U.S. Application Data

(63) Continuation of application No. 09/117,199, filed as application No. PCT/DE97/00130 on Jan. 17, 1997.

(30) Foreign Application Priority Data

Jan. 27, 1996 (DE) .............................................. 196 02 943
May 11, 1996 (DE) .............................................. 196 19 207

(51) Int. Cl.[7] .................................................... H05K 7/20
(52) U.S. Cl. .................... 165/80.3; 165/185; 165/361; 165/704; 165/29; 165/890.03; 165/509; 165/514
(58) Field of Search ............................ 29/509, 514, 515; 165/80.3, 185; 361/704, 710

(56) References Cited

U.S. PATENT DOCUMENTS

| | | | |
|---|---|---|---|
| 3,517,472 | * | 6/1970 | Toth ........................................ 29/509 |
| 3,735,465 | * | 5/1973 | Tibbetts et al. .......................... 29/509 |
| 5,042,257 | * | 8/1991 | Kendrick et al. ......................... 62/3.1 |
| 5,193,498 | * | 3/1993 | Futami ............................... 123/90.31 |
| 5,282,364 | | 2/1994 | Cech . |
| 5,689,873 | * | 11/1997 | Luhm ................................. 29/525.11 |
| 5,912,802 | * | 6/1999 | Nelson .................................. 361/695 |

FOREIGN PATENT DOCUMENTS

| | | |
|---|---|---|
| 34 15 554 | 10/1984 | (DE) . |
| 35 18 310 | 11/1986 | (DE) . |
| 93 15 056 | 2/1994 | (DE) . |
| 94 09 517 | 9/1994 | (DE) . |
| 94 12 818 | 12/1994 | (DE) . |
| 295 20 474 U | 4/1996 | (DE) . |
| 0 335 589 | 10/1989 | (EP) . |

\* cited by examiner

*Primary Examiner*—Allen Flanigan
(74) *Attorney, Agent, or Firm*—Collard & Roe, P.C.

(57) ABSTRACT

A method of manufacturing cooling devices made up of several metal shaped-section elements. The method calls for grooves and beads on each of the shaped-section elements to be fitted into each other and connected by the application of pressure in the transverse direction. The outwards-protruding groove walls, designed as beads, on one element are pushed into suitably located grooves in a neighboring section, bending inwards and/or deforming plastically so that each bead entering its associated groove is, physically locked in place. Also proposed are shaped-section elements for us in the cooling device and cooling devices manufactured by the method of such elements.

12 Claims, 8 Drawing Sheets

METHOD OF MANUFACTURING COOLING DEVICES MADE UP OF SEVERAL METAL SHAPED-SECTION ELEMENTS FOR MOUNTING ON SEMICONDUCTOR COMPONENTS, SHAPED-SECTION ELEMENTS FOR USE IN THE MANUFACTURE OF SUCH COOLING DEVICES, AND COOLING DEVICES MANUFACTURED BY THE METHOD

This application is a Continuation Patent Application of U.S. patent application Ser. No. 09/117,199, filed on Jul. 24, 1998, which is a 371 of PCT/DE97/00130 filed on Jan. 17, 1997.

The invention relates to a method of manufacturing cooling devices consisting of a plurality of shaped-section part elements made from metal, by which grooves and beads formed on the shaped-section part elements are plugged into each other and joined in the transverse direction by application of pressure.

Cooling devices intended for mounting on semiconductor components are known in the form of hollow chambers with inserted cooling ribs, which permit flow-through in the longitudinal direction and consist of two extruded, about U-shaped shaped-section part elements made of aluminum. The outer section walls of such elements engage each other in each case like a groove and a spring. A groove is shaped by molding in each case on one of said section walls of a shaped-section part element, and a bead on the wall of the other shaped-section part element. However, the two shaped-section part elements, which are preferably identical, are actually joined with one another via bridge-like cooling ribs having hollow chambers. With their suitably designed, approximately U-shaped ends, such cooling ribs are fitted in matching grooves on the inner sides of the shaped-section part elements and locked in place in said grooves by application of pressing pressure as required. However, due to the high pressing pressure required for this purpose it is not possible in practical life to manufacture such cooling devices. by the described method with adequately long lengths. Consequently only relatively short cooling device units can be manufactured in the form of shaped-section part elements, which makes the cooling devices produced by said method relatively expensive.

Processes for producing semi-open cooling devices are known from both DE-PS 25 02 472 and DE-PS 35 18 310, in which the cooling ribs are retained on a base plate pressed into matching receiving grooves. Roller-like pressing dies are employed in said processes for acting on the intermediate bridges on the base plate between the individual cooling ribs, forcing material into adjacent rib spaces on the cooling ribs. However, only semi-open cooling devices can be manufactured in this way. Because of the type of mounting employed it is not possible to produce the spacings between the cooling ribs with any desired narrowness.

A process for manufacturing cooling devices—which are semi-open as well—is known from DE-PS 34 15 554, in which metal shaped-section part elements with an approximately T-shaped cross section are joined by plugging with grooves and bridges shaped by molding on or in the head bridge, and each plug connection is fixed by cold welding in the direction transverse relative to said joint. Such cold welding, however, required very high pressing pressures, which with conventional dies can be applied to only relatively short lengths. During cold welding, an atomic convergence of the surfaces contacting each other takes place due to the high contact pressure. The relative motion or surface enlargement occurring in this process on the lines of separation destroys the oxide skin, as a rule, and permits a welded connection. In the manufacture of such cooling devices, however, the high pressing pressures require additional inner support, which can be realized only with semi-open cooling devices, to begin with. Inner cooling were found to be disadvantageous in this connection, as such ribs make accessibility for the support more difficult.

The problem of the invention is to propose a process for the manufacture of cooling devices preferably of the hollow section construction, but also with the semi-open construction, by which cooling devices with good thermal conductivity, adequate torsional strength and strength can be manufactured at low cost. Furthermore, the problem of the invention is to propose shaped-section part elements for such manufacture, as well as cooling devices produced by the process.

The problem of the invention is solved by a method according to claim 1. Claims 2 and 3 propose suitable molding methods permitting also plastic deformation of the outwardly protruding or projecting groove walls. Different structural heights of cooling devices can be realized with a small number of different shaped-section part elements belonging, however, to the same system family.

It is possible by such a method as defined by the invention to manufacture cooling devices or strands of cooling devices of a very great length with relatively low expenditure in terms of production engineering. If need be, such strands can be divided in shorter segments. The shaped-section part elements required at the same are at least partly fixed against each other already during mounting, so that additional holding devices can be omitted. Following mounting of the shaped-section part elements against each other, molding or deformation of the outwardly projecting groove walls takes place on the connection sides of the cooling devices or strands of cooling devices, which leads to a very intimate and mechanically strong connection with the adjacent beads of the corresponding shaped-section part elements, such connection promoting the passage of heat. This connection technique, which is applicable to both closed and semi-open cooling devices, does not influence the type and the arrangement of the inner cooling ribs, so that their design is freely selectable at least under this aspect.

Shaped-section part elements with the features of claims 4 to 6 are suitable in a particularly favorable way for carrying out the method as defined by the invention. With such embodiments of the shaped-section elements, a particularly intimate positive clamping of two beads in a site of connection is obtained within the zone of their points of connection following mounting and molding. Both the shaped-section elements according to claims 4 to 6 and 10 and also shaped-section elements according to claim 11 can be manufactured in a simple way as extruded sections made from aluminum alloys.

With cooling devices according to claims 7 and 8, possible bending of their contact surfaces, which have to be smooth and plane, is avoided.

With shaped-section part elements according to claims 9 and 10 it is possible to manufacture hollow cooling devices in which the walls of the shaped-section part elements serving for the connection, following a smoothing treatment, form the contact surface for mounting thereon a semiconductor component. The heat conduction is promoted in such a cooling device because the currents of heat pass through the outer wall segments of the shaped-section element disposed perpendicular to the contact area, and through the wall segments of the shaped-section element disposed parallel with said area.

The method as defined by the invention and cooling devices manufactured by said method are explained in greater detail by exemplified embodiments shown in the drawing, in which.

Figure 3:
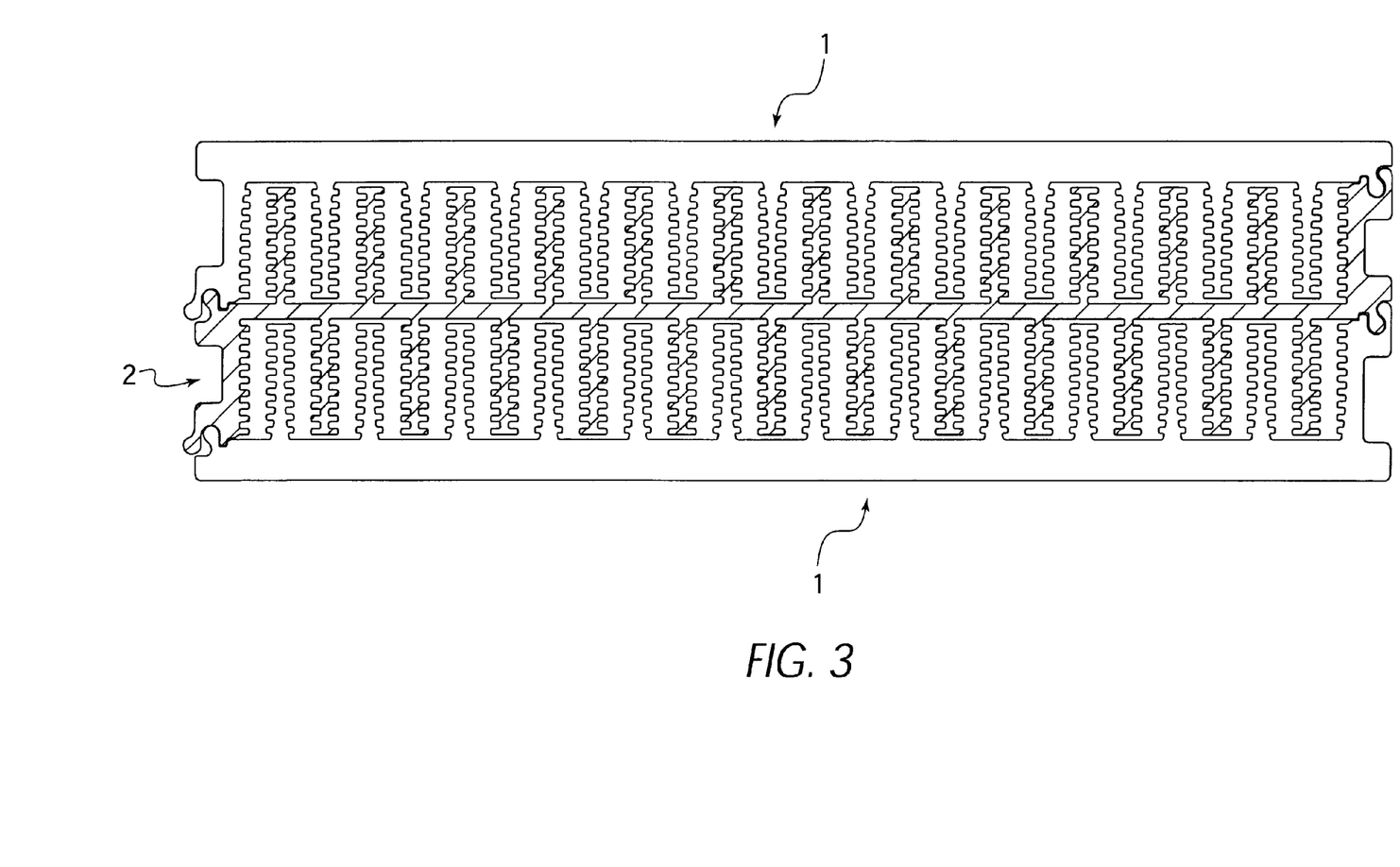
FIG. 3 shows a cross section through a cooling device with corresponding mounting arrangements, such device being made up of three dish-like shaped-section elements with formation of two hollow chambers.
Figure 4:
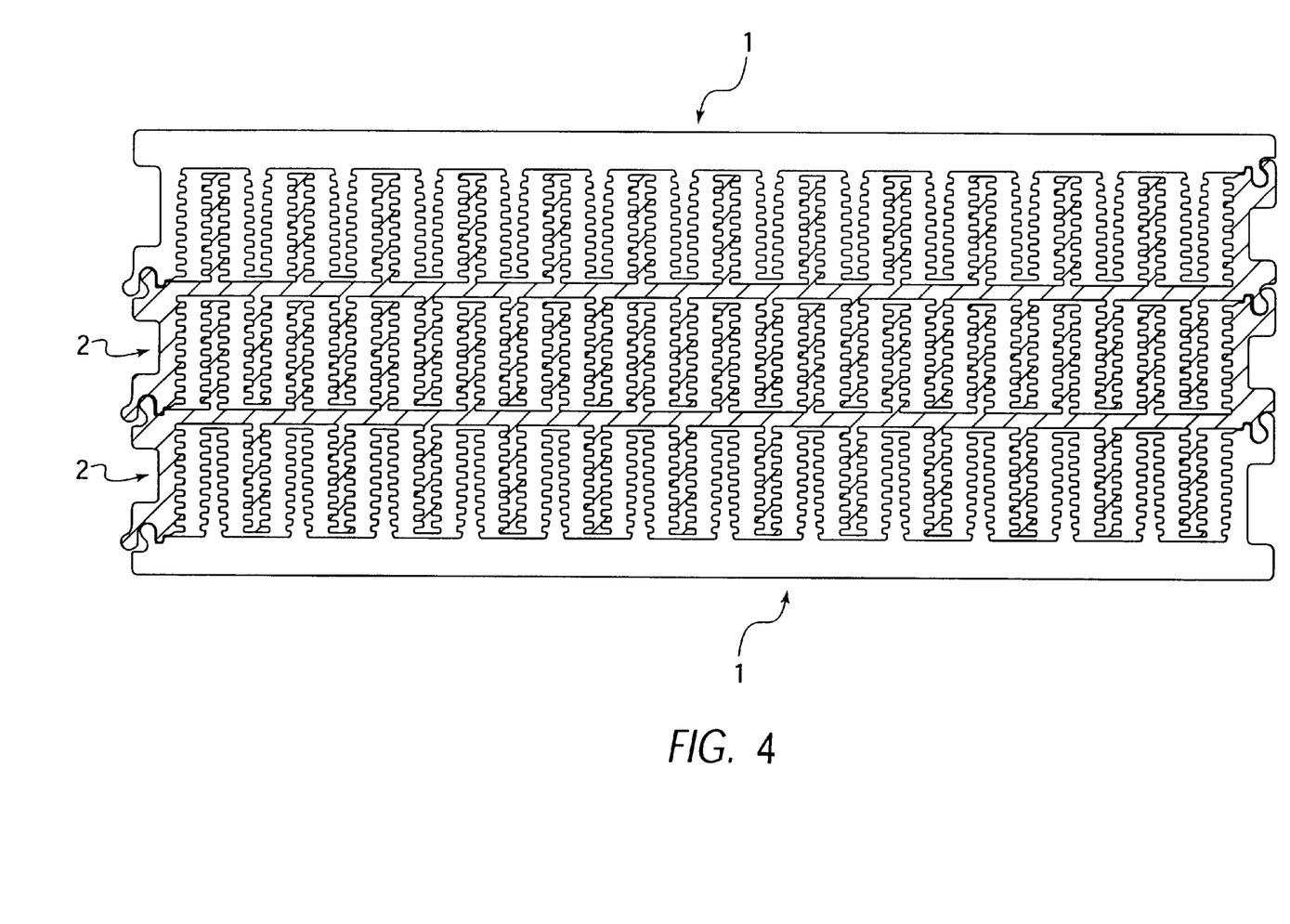
FIG. 4 is a cross-sectional representation with a cross section through a cooling device with three hollow chambers.
Figures 5, 6:
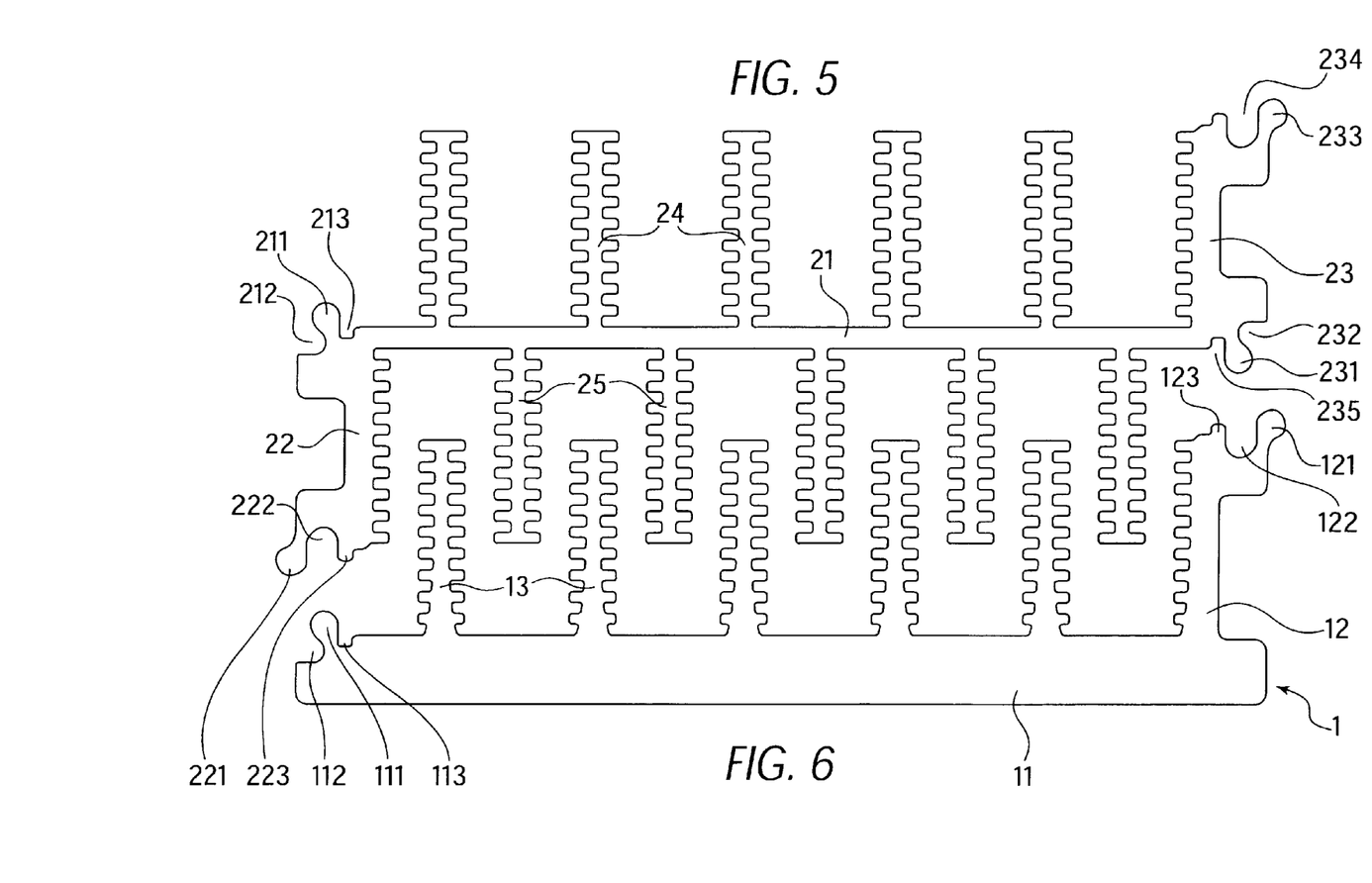
FIGS. 5 and 6 are enlarged representations of the two dish-like shaped-section elements used in the preceding embodiments.
Figure 7:
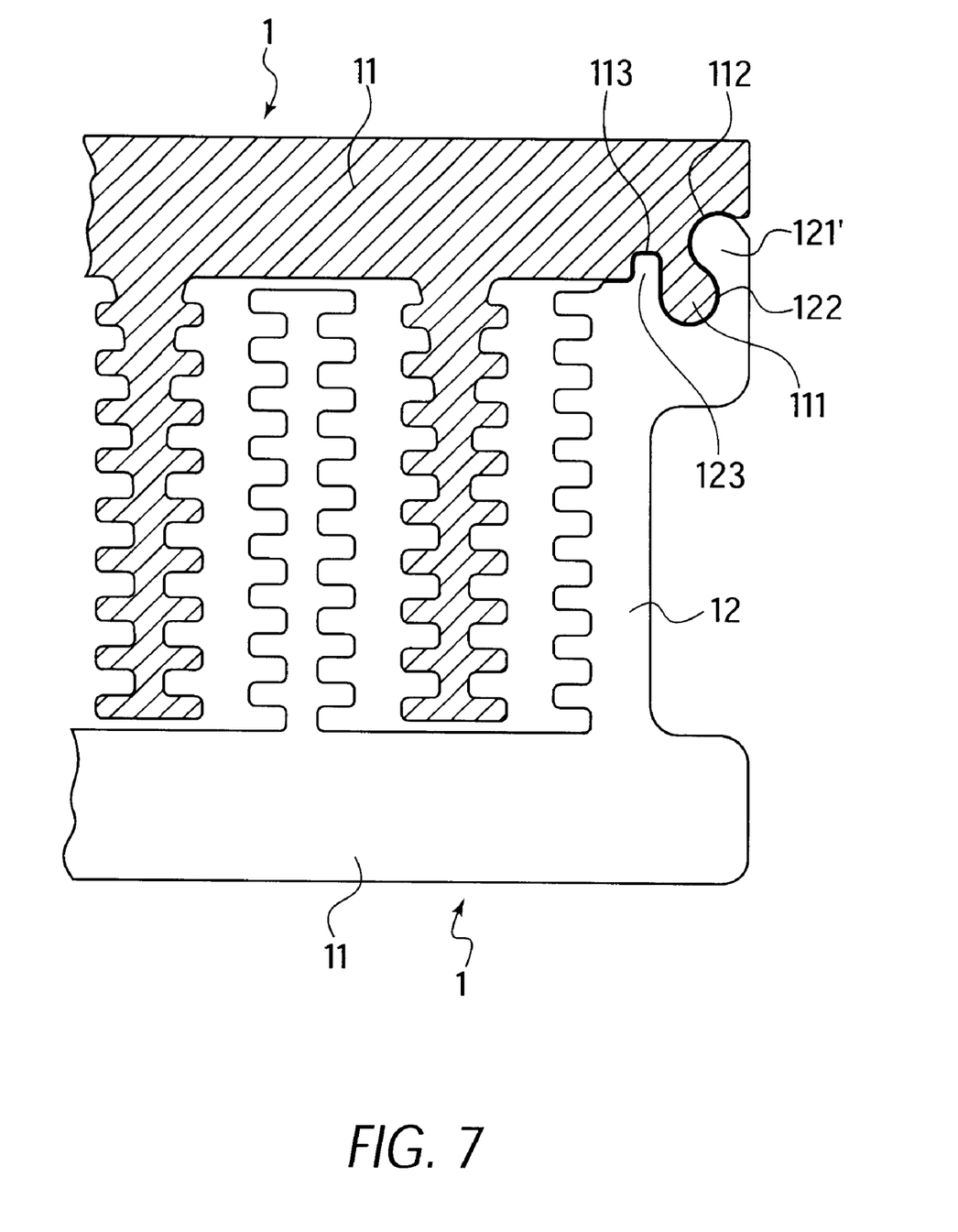
FIG. 7 is a sectional representation of the enlarged area of a connection site of two dish-like shaped-section elements after molding.

With shaped-section part elements 1 and 2 according to FIGS. 5 and 6, which are manufactured from aluminum alloy, cooling devices or strands of cooling devices with one or a plurality of hollow chambers can be manufactured, such devices being shown by way of example in FIGS. 1 to 4. Shaped-section part elements 1 according to FIG. 6 have an approximately L-shaped cross section. The first shaped-section element wall denoted by reference numeral 11 forms a contact surface for a semiconductor component (not shown) to be cooled, with the second shaped-section element wall 12 being shaped by molding on said first wall perpendicular to the latter. Cooling ribs 13, which are spaced from each other, are shaped by molding on the inside of the first shaped-section element wall 11, such cooling ribs being arranged about parallel eith thr second shaped-section element wall 12. Outwardly projecting beads 111 and 121 are formed by molding on both the free face side of the first shaped-section element wall 11 and the free face side of the second shaped-section element wall 12, said beads at the same time forming the wall surface for an adjacently arranged, correspondingly formed groove 112 and, respectively, 122.

Figure 1:
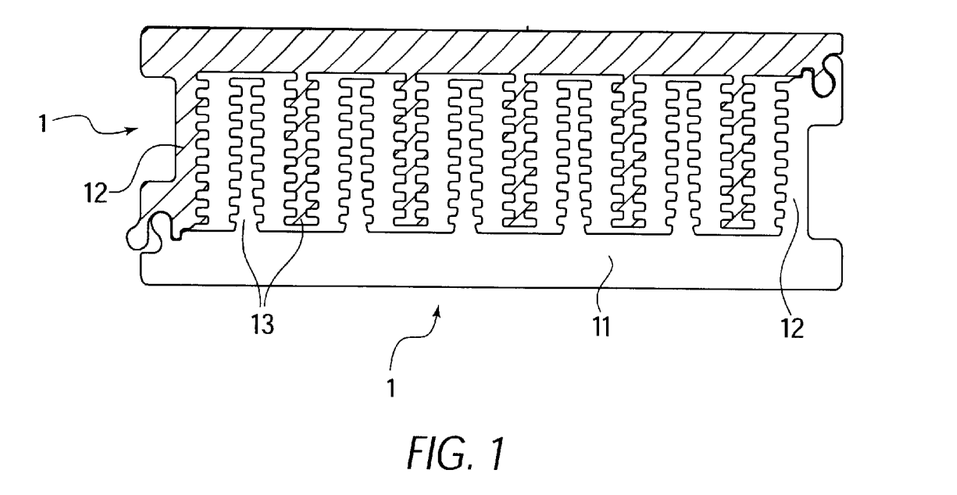
FIG. 1 shows a cross section through a cooling device produced from two idential dish-like shaped-section elements, whereby the left side shows the mounting position prior to molding, and the right side shows the connection of the shaped-section elements following molding.

With two of such shaped-section part elements 1 according to FIG. 6, which are mounted displaced against each other by 180 degrees, a cooling device according to FIG. 1 can be produced. As indicated on the left side of FIG. 1, the two shaped-section part elements 1 are installed in such an arrangement against each other, whereby beads 111 and 121 of part element 1 engage grooves 112 and 122 of the other dish-like element 1 at least partly in a form-locked way, whereby said two dish-like elements 1 are already fixed against one another. In addition, beads 123 engage the corresponding grooves 122. In said preliminarily fixed mounting arrangement, beads 112 and 121 are pressed into the associated grooves 122 and 112 transversely relative to the longitudinal direction of the part-element arrangement, which produces a very intimate clamped connection combined with material deformation. Advantageously, grooves 112 and 122 may be slightly undercut, so that the beads 111 and 121, which are widened in a rounded way also in the head range, can be fixed in said grooves with low expenditure of force.

Figure 2:
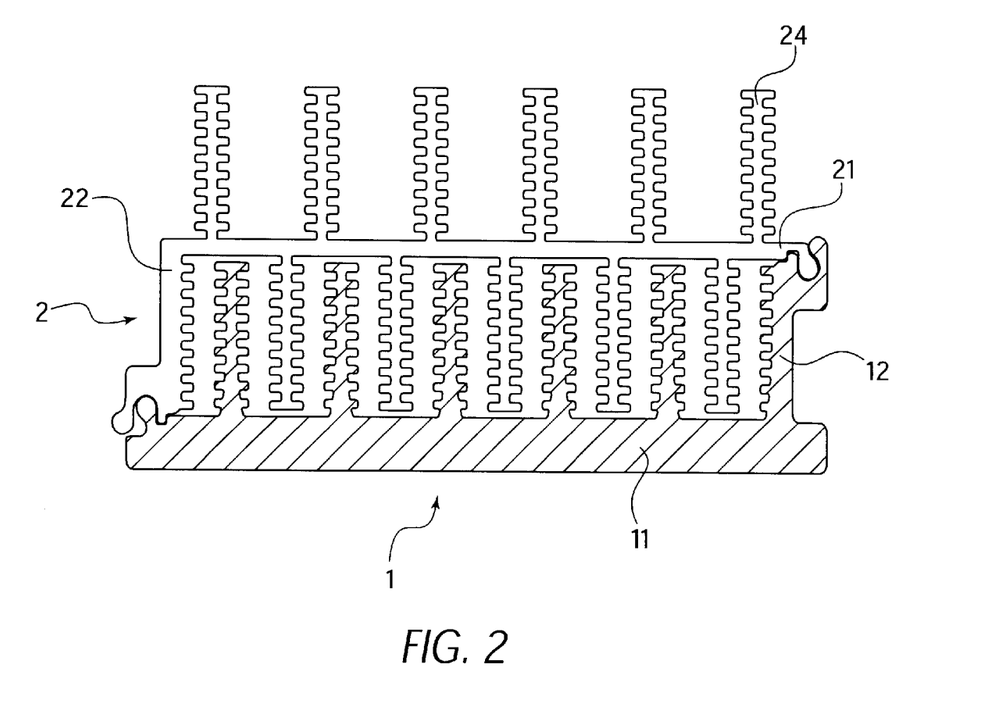
FIG. 2 shows a cross section with the same mounting situations of a hollow cooling device made up of two different dish-like shaped section elements with cooling ribs additionally arranged outwardly on one side of one dish-like shaped-section element.

Cooling devices with a plurality of hollow chambers and, if need be, with a semi-open chamber at the end side according to FIGS. 2 to 4 can be manufactured when additionally using shaped-section part elements 2 according to FIG. 5, which have an approximately Z-shaped cross section. Such elements have an element wall 21, on which the cooling ribs 24 and 25 are formed by molding preferably on both sides with a spacing between said ribs. At the ends of element wall 21, element walls 22 and 23 are formed by molding vertically relative to different sides. Both shaped-section element wall 21 and shaped-section element walls 22 and 23 again have the projecting beads 211, 221 and 233 required for the connection, with correspondingly shaped grooves 212, 222, 232 and 234 being associated with said beads, neighboring on the latter. Provision is made for additional beads 223 and grooves 213 on this part element 2 as well. Such dish-like shaped-section elements 2 can be mounted both among each other and with dish-like elements 1 and joined with one another by pressing them together.

Figure 8:
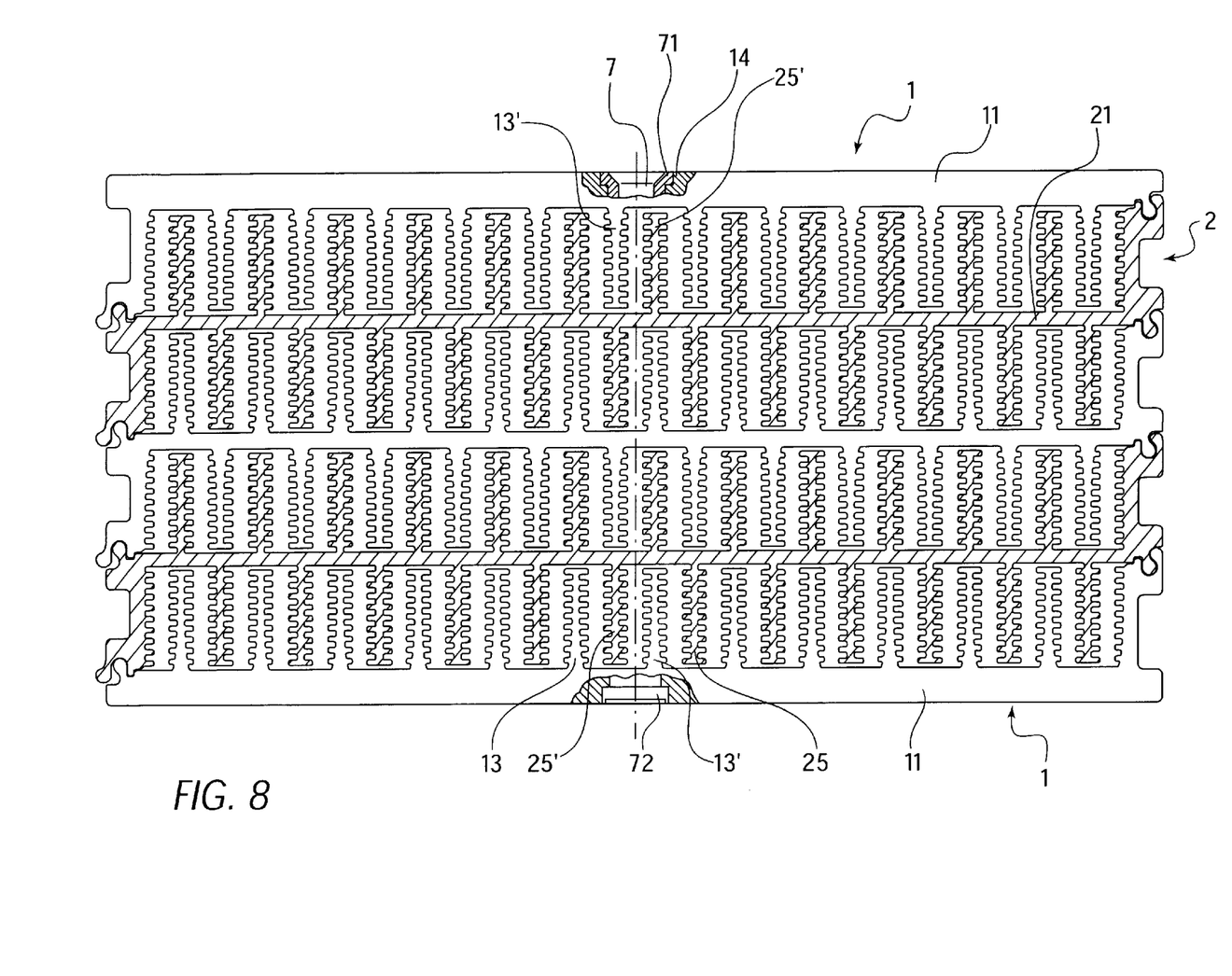
FIG. 8 shows a section through a cooling device made up of three hollow chambers, with an additional clamping connection.

FIG. 8 shows a cooling device according to the structure shown in FIG. 5, whose outer shaped-section part elements 1 are connected within the zone of their outer walls 11 by one or a plurality of rivet pins 7, whose heads 71 and 72 are received in countersunk bores 14 in said element walls 11. The connection is reinforced with said rivet pin 7 and it is assured that said element walls 11, which may form contact surfaces, will not bend.

Especially with cooling devices according to FIG. 8 it is possible to create plane-parallel contact surfaces by using part elements 1 and 2 in which at least in the center, one or several cooling ribs 13' and, respectively, 25' are slightly longer than the adjacent cooling ribs 13 and 25, so that it is assured that due to the clamping connection via pins 7, the adjacent element walls 11 and 21 of part elements 1 and 2 will rest against said projecting ribs. With such a construction, the part elements may be milled in the finest way on the outside on the contact surfaces, so that plane-parallel surfaces are produced which are safely supported at least in the center.

However, such inner support of the cooling devices is basically possible also without the additional clamping connections because the outer pressed connections are tensible to such an extent that they are capable of absorbing tensile forces occurring in the marginal zone because of the inner support.

Figure 9:
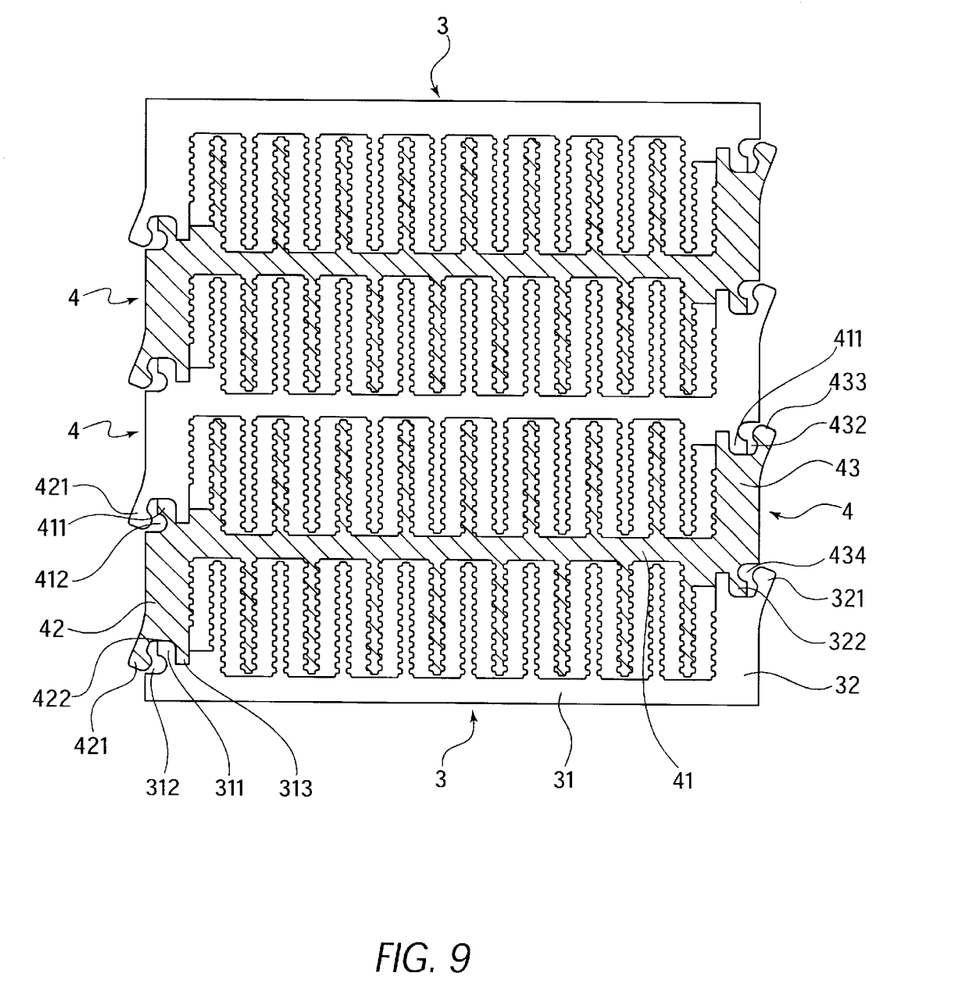
FIG. 9 shows a cross section through the mounting arrangement of a plurality of shaped-section part elements prior to molding on the connection sides.
Figure 10:
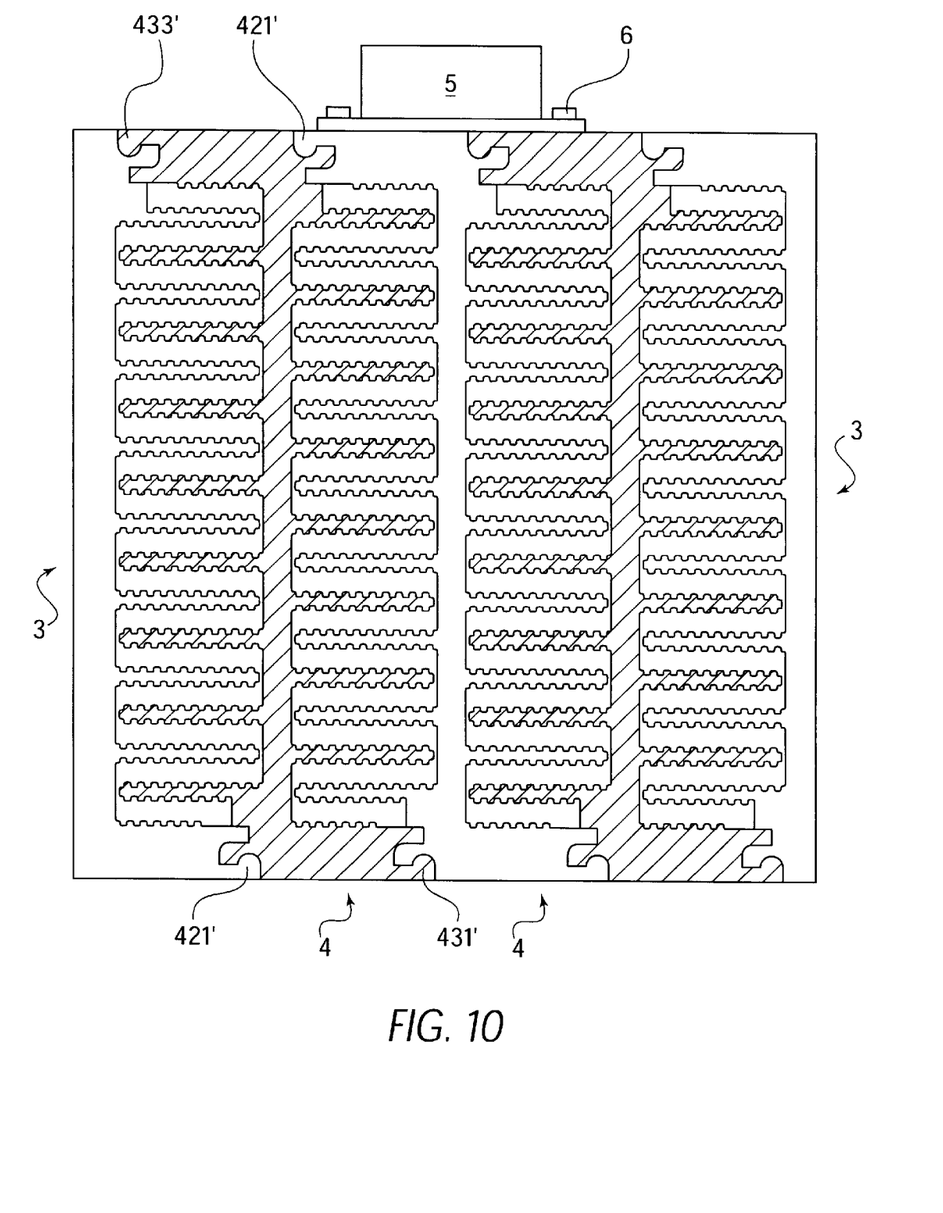
FIG. 10 shows a corresponding cross section through the arrangement in FIG. 9 after the outwardly projecting beads have been molded into the corresponding associated grooves.

For producing a hollow-chamber shaped-section element according to FIG. 10, part elements 3 with an L-shaped cross section and part elements 4 with a Z-shaped cross section are arranged or premounted in the positions shown in FIG. 9. The two outer L-shaped part elements 3 have a bead strip 311 on element wall 31 at the end and directly adjacent the grooves 312 and 313. A groove 322 is formed on the other element wall 32 on the face side, whose bead 321 forming the groove wall protrudes outwardly. The other part elements 4 connectable with such a part element 3 consist of the center element wall 41 with the cooling ribs shaped vertically by molding on both sides of said wall, and the element walls 42 and 43 arranged on the end sides. Provision is made again for grooves 422 and 432 on the face sides of element walls 42 and 43, said grooves being limited by the outwardly projecting bead strips 421 and, respectively, 433. Said grooves 422 and 432 are engaged by the bead strips 311 and 411 of adjacent part elements 3 and, respectively, 4.

By bending or pressing the outwardly projecting beads 321 and 421 into the associated grooves 431 and of the adjacent part elements, for example by means of rollers or stamping, part elements 3 and 4 are finally intimately clamped with each other. One connection of a hollow-chamber cooling device according to FIG. 10 manufactured in said way forms after a cutting treatment the plane and smooth contact surface for a conductor component denoted by reference numeral 5 which, for example, may be mounted with screws 6. In the present representation, the beads pressed into the associated grooves are denoted by the reference numerals 421' and, respectively, 433'.

List of Reference Numerals

| | |
|---|---|
| 1 | Shaped-section part element |
| 11 | Element wall |
| 111 | Bead strip |
| 112 | Groove |
| 113 | Groove |
| 12 | Element wall |
| 121 | Bead |
| 121' | Deformed bead |
| 122 | Groove |
| 123 | Bead strip |
| 13, 13' | Cooling ribs |
| 14 | Countersunk bore |
| 2 | Shaped-section part element |
| 21 | Element wall |
| 211 | Bead strip |
| 212 | Groove |
| 213 | Groove |
| 22 | Element wall |
| 221 | Bead |
| 222 | Groove |
| 223 | Bead strip |
| 23 | Element wall |
| 231 | Bead strip |
| 232 | Groove |
| 233 | Bead |
| 234 | Groove |
| 235 | Groove |
| 24 | Cooling rib |
| 25, 25' | Cooling rib |
| 3 | Shaped-section part element |
| 31 | Element wall |
| 311 | Bead strip |
| 312 | Groove |
| 313 | Groove |
| 32 | Element wall |
| 321 | Bead |
| 322 | Groove |
| 4 | Shaped-section part element |
| 41 | Element wall |
| 411 | Bead strip |
| 412 | Groove |
| 42 | Element wall |
| 421, 421' | Bead strip |
| 422 | Groove |
| 43 | Element wall |
| 431 | Bead strip |
| 432 | Groove |
| 433, 433' | Bead |
| 434 | Groove |
| 5 | Semiconductor component |
| 6 | Screw mounting |
| 7 | Rivet pin |
| 71 | Head |
| 72 | Head |

What is claimed is:

1. A method of producing cooling elements for attachment on semiconductor components, comprising:
   connecting extruded part sections having a plurality of cooling part sections, ribs said forming a hollow chamber and, said ribs being parallel disposed with respect to each other;
   forming grooves and strips extending on the part sections, said grooves and strips extending in a longitudinal direction;
   connecting the grooves of one part section to the ribs of another part section for mounting the part sections such that the part sections are plugged into each other and are fixedly secured; and
   plastically deforming each strip into a corresponding groove in a transverse direction.

2. The method according to claim 1, wherein said molding step is accomplished with rollers guided parallel with the longitudinal direction of the bridge strips and grooves.

3. The method according to claim 1, wherein said molding step is accomplished step by step in intervals by stamping.

4. A part section for producing cooling elements comprising:
   a first wall element having an inner and outer surface;
   a second wall element having an inner and outer surface and being molded perpendicularly to the inner surface of the first wall element at one end forming an L-shaped cross section;
   a plurality of cooling ribs molded perpendicularly onto the inner surface of the first wall, and said ribs extending parallel to each other and parallel to the second wall element;
   a bridge strip molded to an outer surface of the second wall element and molded onto the inner surface of the first wall element; and
   a groove formed by said bridge strip, wherein when connected to another part section said groove engages with a corresponding, bridge strip on the other part section by a plastic deformation step.

5. The part section according to claim 4, wherein said cooling ribs are disposed on the inner surface and the outer surface of the first wall element, and a groove and a bridge strip are formed on the face side; and that the two externally smooth outer section walls have groove walls, said grooves extending through on the face side.

6. The part section according to claim 4, further comprising a groove and a bridge strip disposed on the outer surface of the first wall element, and an additional groove with an outwardly projecting bridge forming the groove wall disposed on the outer surface of the second wall element.

7. The part section according to claim 6, further comprising a plurality of clamping connections spaced from each other in the longitudinal direction for attaching a plurality of part sections to each other, said clamping connections each supporting themselves on the section walls of the outer part sections supporting the cooling ribs.

8. The part section according to claim 7, wherein said clamping connections each are rivet fixed on two outer part sections and passed through part sections arranged in between.

9. The part section according to claim 6, wherein said plurality of cooling ribs are formed slightly longer than adjacent cooling ribs wherein, said cooling ribs abut the respective wall of the respective adjacent part sections.

10. The part section according to claim 4, wherein outer interconnected section walls of the part sections form contact surfaces for a semiconductor component to be attached.

11. The part section according to claim 10, wherein a thickness of the outer section walls is greater than a thickness of the other section walls supporting the cooling ribs.

12. The part section for producing a cooling element according to claim 4, further comprising:
- an additional second wall element disposed perpendicularly to the outer surface of the first wall element at the other end forming a Z-shaped cross section; and
- a plurality of cooling ribs molded onto the outer surface of the first wall section, said ribs extending parallel to each other and parallel to the second wall element.

* * * * *